United States Patent
Li et al.

(10) Patent No.: US 8,269,570 B2
(45) Date of Patent: Sep. 18, 2012

(54) SYSTEMS AND METHODS OF RIPPLE REDUCTION IN A DC/DC CONVERTER

(75) Inventors: Xuening Li, Cary, NC (US); Hal Chen, Hoboken, NJ (US); Weidong Zhu, East Lyme, CT (US); Wenkai Wu, East Greenwich, RI (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 12/849,799

(22) Filed: Aug. 3, 2010

(65) Prior Publication Data

US 2012/0032748 A1    Feb. 9, 2012

(51) Int. Cl.
*H03K 7/08* (2006.01)
*G05F 1/62* (2006.01)
*G05F 1/00* (2006.01)

(52) U.S. Cl. .................. 332/109; 323/288; 323/282

(58) Field of Classification Search .......... 332/109–111; 323/265, 266, 282, 288, 283, 284, 224
See application file for complete search history.

(56) References Cited

U.S. PATENT DOCUMENTS

| 7,417,473 B2* | 8/2008 | Kawamoto | 327/108 |
| 7,573,250 B2* | 8/2009 | Clavette | 323/288 |

* cited by examiner

*Primary Examiner* — Ryan Johnson
(74) *Attorney, Agent, or Firm* — William B. Kempler; Wade J. Brady, III; Frederick J. Telecky, Jr.

(57) ABSTRACT

Systems and devices for ripple reduction in a DC/DC converter are presented. The disclosed systems and methods enable ripple reduction in discontinuous conduction mode (DCM) operation. In DCM, the inductor current peak to peak ripple may be reduced based on the load current. To achieve the reduction of the inductor peak to peak current ripple, a digital counter is used to count the time between consecutive PWM pulses. The digital output of the counter is used to control the pulse width modulation. As the digital output of the counter increases, the PWM on-time decreases. Since the PWM pulse is demanded by the load in DCM mode, the peak to peak inductor ripple is modulated by the counter, or, in turn, modulated by the load current.

20 Claims, 5 Drawing Sheets

US 8,269,570 B2

SYSTEMS AND METHODS OF RIPPLE REDUCTION IN A DC/DC CONVERTER

TECHNICAL FIELD

The present disclosure is generally related to electronics and, more particularly, is related to power supply controllers.

BACKGROUND

A buck converter, as provided in example circuit 100 of FIG. 1, operates by applying a pulse width modulated (PWM) waveform to L-C filter 103 comprising inductor 125 and capacitor 130. L-C filter 103 averages the PWM waveform, resulting in a DC output voltage. A variation on a simple buck replaces a "catch" diode with controlled switch 115, or Synchronous Rectifier (SR). Synchronous rectifier 115 generally has lower losses than a conventional or Schottky diode, and so its use is quite popular in low voltage DC/DC converters. There are heretofore unaddressed needs with dc/dc converter systems and methods.

SUMMARY

Example embodiments of the present disclosure provide systems of ripple reduction in a DC/DC converter. Briefly described, in architecture, one example embodiment of the system, among others, can be implemented as follows: a comparator configured to compare an output of an error amplifier with a rising ramp signal to produce a pulse width modulated (PWM) signal; a counter electrically connected to the comparator, the counter clocked by a system oscillator, the counter configured to count a number of system oscillator pulses between successive inductor current peaks; and a plurality of current sources electrically connected to the counter, the plurality of current sources configured to charge a ramp capacitor, the charging of the ramp capacitor producing the rising ramp signal.

Embodiments of the present disclosure can also be viewed as providing methods for ripple reduction in a DC/DC converter. In this regard, one embodiment of such a method, among others, can be broadly summarized by the following: regulating an output with a pulse width modulated (PWM) signal comprising at least one inductor and an oscillator configured with a rising ramp signal; counting with an x-bit counter a number of periods of the oscillator between inductor current pulses, where x is the number of bits of the counter; and adjusting the slope of the rising ramp signal dependent on an output of the counter.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

In an ideal (lossless) buck converter, the input voltage and the duty cycle of the switch determine the output voltage.

$$VOUT = D \times VIN = \left(\frac{ton}{TS}\right) \times VIN$$

where duty cycle D is defined as the ratio of the main switch ON time to the total period. This relationship holds as long as there is continuous current flowing in the inductor. Another important relationship relates the inductor value to the amount of AC ripple current in the converter.

$$\Delta Iout = \frac{(Vin - Vout) \times D \times TS}{L}$$

where $\Delta Iout$ is the peak-to-peak ripple current in the output inductor. Notice the effect the input to output voltage differential has on the result.

Figure 1:
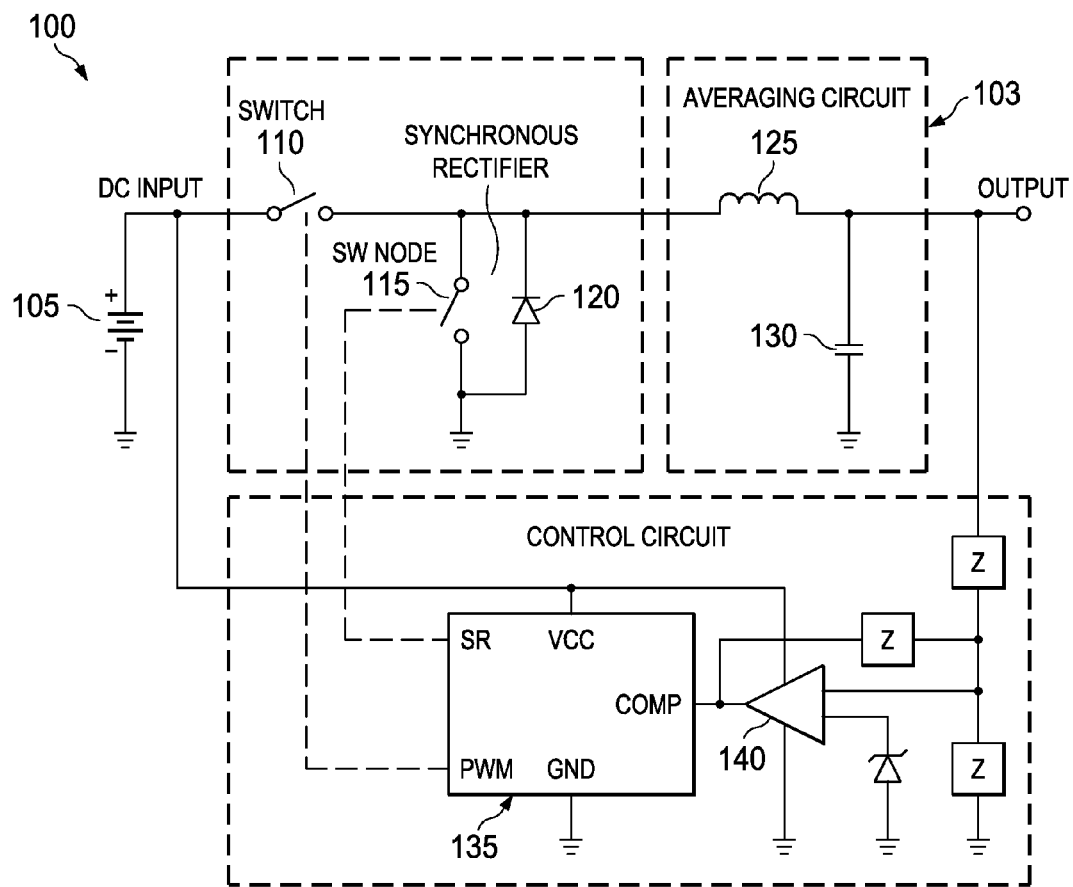
FIG. 1 is a circuit diagram of an example embodiment of a prior art DC/DC converter.
Figure 2:
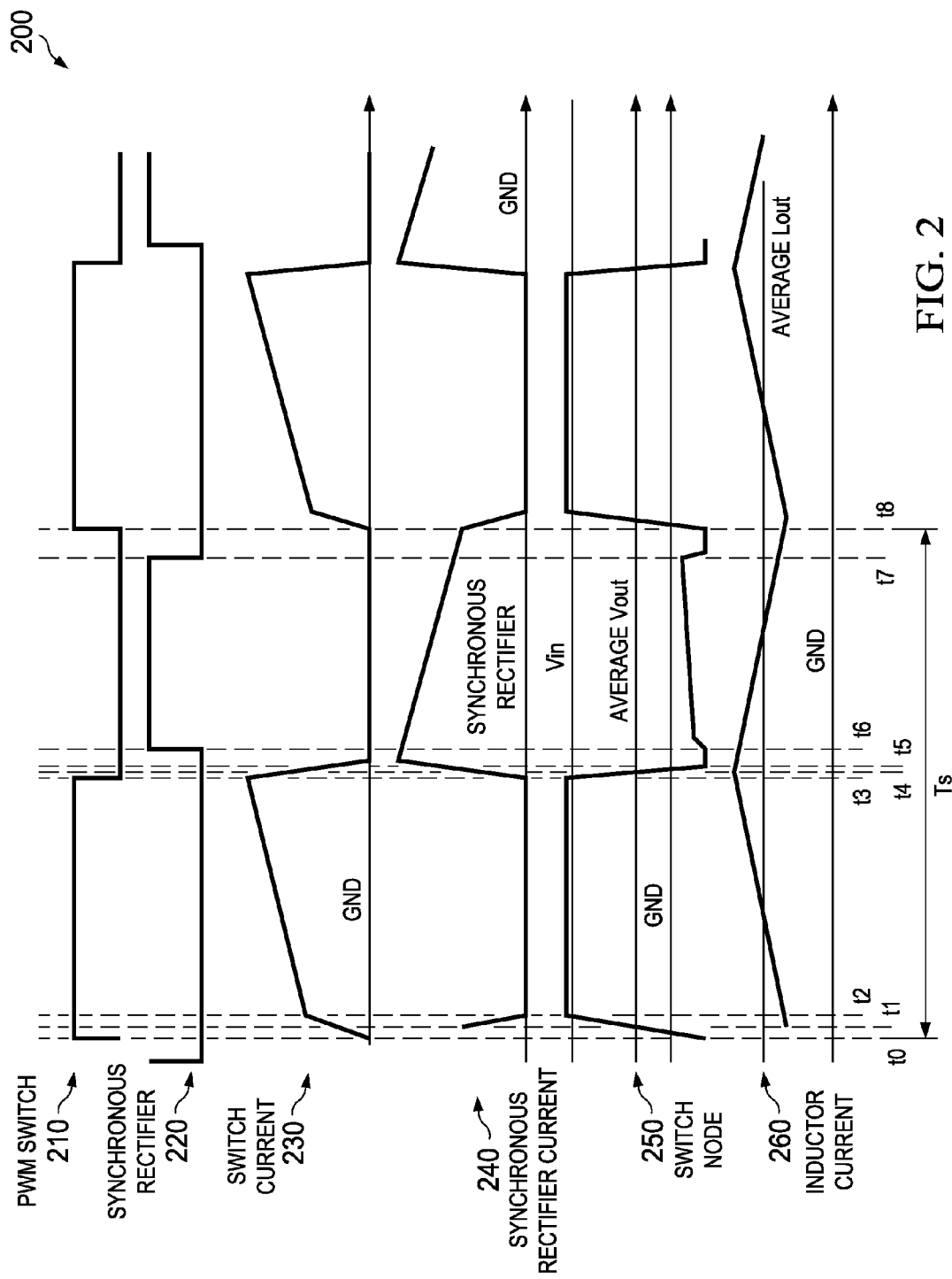
FIG. 2 is a timing diagram of an example embodiment of the circuit of FIG. 1.

FIG. 2 provides timing diagram 200 of a switching cycle for a converter such as the circuit provided in FIG. 1. At some time just prior to t0, signal 220 from control IC 135 turns OFF SR 115. At t0, PWM signal 210 turns ON main switch 110 and inductor current 260 starts to transition from SR 115 to switch 110. At t1, SW node voltage 250 rises above the Vout voltage level and the current in switch 110 and inductor 125 begins to increase as shown with signals 230 and 260. At t2, the switching transition is complete. At t3, PWM signal 210 turns OFF switch 110, and inductor current 260 begins to transition to body diode 120 of SR 115. At t4, SW node voltage 250 falls below Vout and the current in SR 115 and in inductor 125 shown in signals 240 and 260 begins to decrease. At t5, the transition is complete and inductor current 260 continues decreasing. At this time, the current is still fully in SR body diode 120. At t6, gate signal 220 driving SR 115 turns ON SR 115 and the current transitions from body diode 120 of that MOSFET to its channel. During the t6-t7 interval, the voltage across SR 115 decays because of the decay of the current in inductor 125. At t7, SR gate signal 220 turns OFF SR 115 and inductor current 260 transitions from the channel back to body diode 120. At t8, the cycle starts again with PWM signal 210 turning on switch 110.

Figure 3:
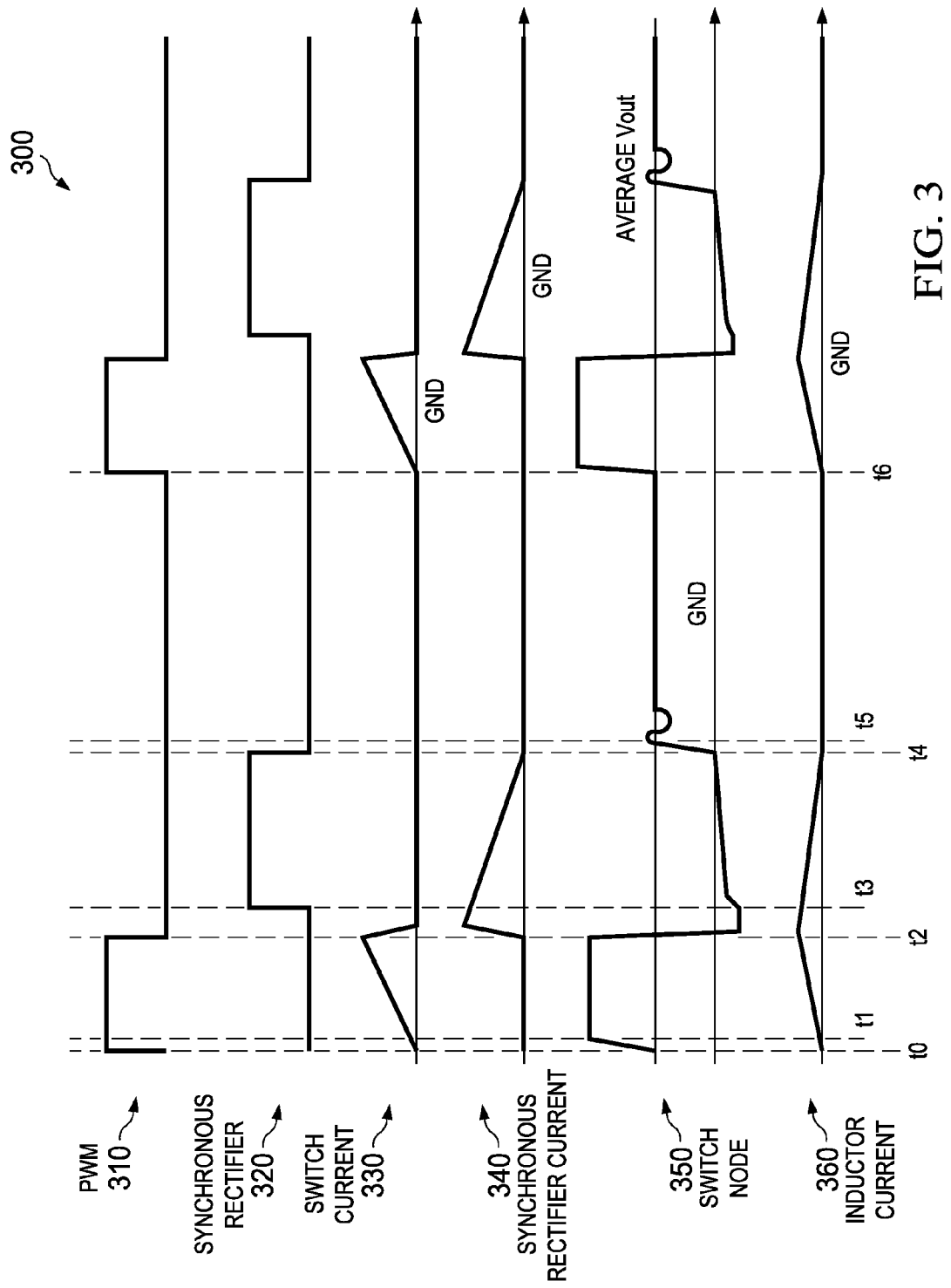
FIG. 3 is a timing diagram of an example embodiment of the circuit of FIG. 1.

One of the key differences in circuit operation between a synchronous and a non-synchronous converter occurs at light loads when the converter's DC load current is less than half the magnitude of the peak-to-peak ripple current ($\Delta Iout$) in the output inductor. In a non-synchronous buck converter, when the inductor current valley attempts to go below zero, current no longer flows due to the rectifier diode's blocking effect as shown in timing diagram 300 in FIG. 3. In this condition, the inductor is running "discontinuous" because flow of inductor current 360 is interrupted. This is commonly referred to as discontinuous conduction mode (DCM). When this occurs at t4, SW node voltage 350 rings up to the output voltage (t4 to t5) and settles at that level until the next switching cycle of PWM signal 310 begins at t6. This low energy ringing is generated by the energy in the inductor resonating with MOSFET parasitic capacitance. When the inductor goes discontinuous, the duty cycle required to maintain output voltage regulation is no longer simply the ratio of the output voltage to the input voltage.

Synchronous converter 100 either (1) can allow current to flow in only one direction as a non-synchronous converter does, or, (2) by allowing the synchronous rectifier 115 to remain ON for the entire t3 to t5 interval, can operate so that current is allowed to flow in the reverse direction. If current is continuous in output inductor 125, then the output voltage remains a linear function of the duty cycle and the loop stability remains constant over the entire load current range. A disadvantage is that under light loads, there is now power dissipated in the channel of SR 115 and in inductor 125 as current flows in the reverse direction.

In applications such as computing power management, light load efficiency becomes more and more important. DC-DC controllers with light load capability are used in mobile computing power and have being adopted in server power applications. Traditional light load control topologies may involve pulse skipping, causing low frequency ripple on the output voltage, which is not easily filtered.

Figure 4:
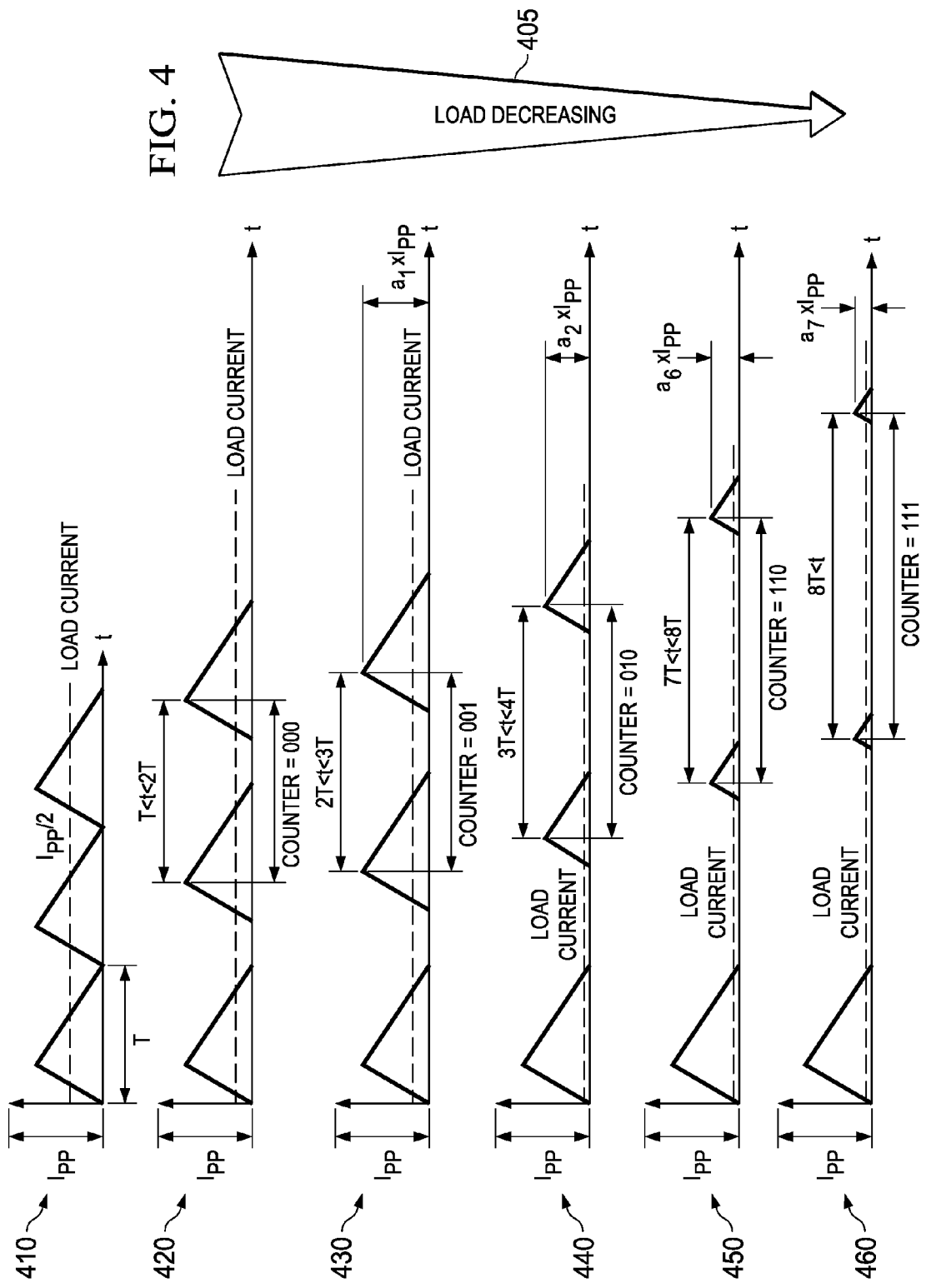
FIG. 4 is a timing diagram of an example embodiment of a circuit using the disclosed systems and methods of ripple reduction in DC/DC converters.

Disclosed herein are systems and methods of ripple reduction in a DC/DC converter. In order to reduce the ripple in DCM operation, the inductor current peak to peak ripple is reduced based on the load current. The output voltage ripple is reduced in DCM, especially in extreme light load conditions. In DCM, the DC/DC converter may operate in inductor ripple reduction mode instead of constant inductor ripple mode. To achieve the reduction of the inductor peak to peak current ripple, a digital counter is used to count the time between consecutive PWM pulses. The digital output of the counter is used to control the pulse width modulation. As the digital output of the counter increases, the PWM on-time decreases. FIG. 4 shows the inductor current peak to peak ripple as load current 405 decreases. Since the PWM pulse is demanded by the load in DCM mode, the peak to peak inductor ripple is modulated by the counter, or, in turn, modulated by the load current.

FIG. 4 provides signal diagram 400 of inductor current as the output load current decreases. Signal 410 provides an example embodiment of a converter operating in continuous conduction mode. (CCM). The peak to peak inductor current may be substantially equal to twice the output load current. In CCM, the inductor current is continuous. It does not fall below zero. In DCM, as shown in signal 420, the inductor current is starting to fall below zero. In an example embodiment, a zero crossing comparator determines if the inductor current falls below zero. When the inductor current falls below zero, this is DCM, or discontinuous current mode. When the inductor current does not fall below zero the converter is working in CCM, or continuous conduction mode. In the circuit producing the signals of FIG. 4, the load current is substantially equal to the average of the inductor current signal, or the area under the inductor current curve.

The ripple on the output voltage is due to the inductor current signal in DCM. In DCM, the time between the peaks of the inductor current becomes larger as the load current decreases. In conventional designs, each inductor current ripple is a fixed unit and the ripples move further apart with decreasing load requirement. This fixed inductor current charges the output capacitor and causes a large ripple on the output. However, in an example embodiment of the disclosed systems and methods of ripple reduction in a DC/DC converter, the magnitude of the inductor current in DCM is reduced to reduce the output voltage ripple. As the distance between the peak values of the inductor ripple current becomes larger, the magnitude of the inductor current is reduced. The inductor current ripple is modulated in order to reduce the output voltage ripple.

In continuous conduction mode as shown in signal 410, the area under the inductor current equals half of the peak to peak inductor current (Ipp). The ramp capacitor is charged with the maximum current source value which supplies the maximum inductor current. With traditional designs, when the output load current decreases and the converter enters into DCM, the period becomes larger such that the distance between the peaks of the inductor current ripple becomes larger.

In an example embodiment of the disclosed systems and methods of ripple reduction in DC/DC converters, a counter counts the number of clocks between falling edges of the PWM signal. The time between the one inductor peak current pulse and the another inductor peak current pulse may be compared to a single clock period, which corresponds to a single inductor current pulse in CCM. In another embodiment, the number of inductor pulses that occur between PWM pulses is counted. The number of MCLK pulses between consecutive instances of the PWM falling edge is counted. If the number of MCLK pulses is more than one, the inductor current may be reduced. In an another embodiment, the beginning of each inductor current pulse may be determined using a zero crossing comparator. When the inductor current is reduced, the ripple on the output is reduced.

In an example embodiment, if the counter counts that the PWM period is longer than one period but less than two system clock periods, as shown in signal 420, the counter counts zero, and the CCM inductor current value is maintained. In an example embodiment with a three-bit counter, if the PWM period is between 2 T and 3 T the inductor current may be reduced or attenuated. When the PWM period is between 2 T and 3 T, as shown in signal 430, the counter output is one. When the PWM period is between 3 T and 4 T as shown in signal 440, the counter output is two. When the PWM period is between 4 T and 5 T the counter output is three and so on. When the PWM period is between 7 T and 8 T as shown in signal 450, the counter output is six. When the PWM period is at 8 T or higher the counter output is seven. In this example embodiment, the counter value equals the lower limit of the period factor minus one, or the output of the counter is substantially equal to the modulus of the number of oscillator pulses between consecutive inductor current peaks (PWM signal falling edges) minus one.

Figure 5:
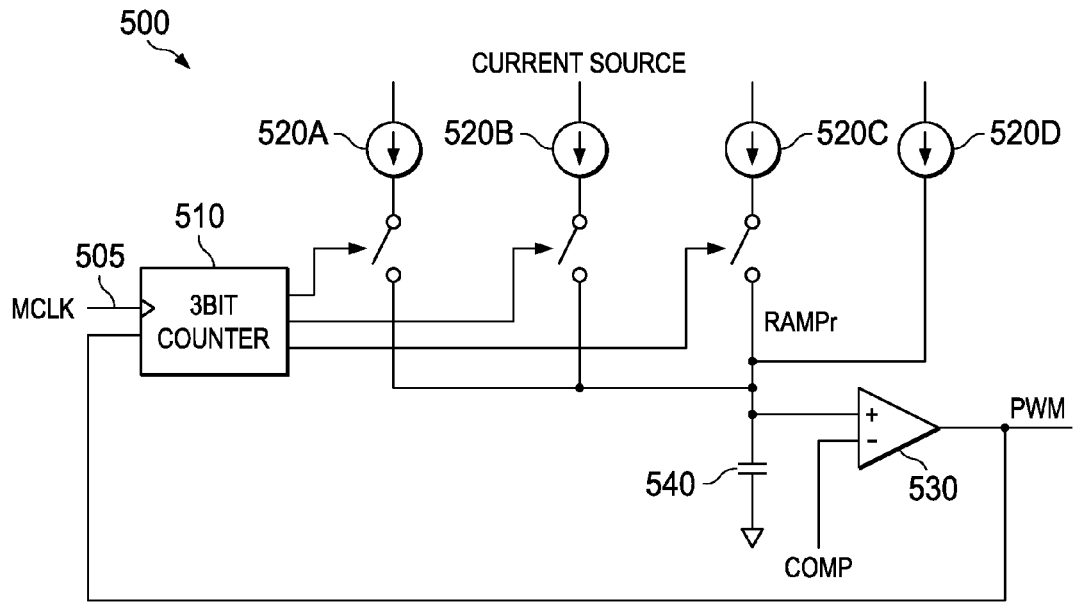
FIG. 5 is a circuit block diagram of an example embodiment of a circuit using the disclosed systems and methods of ripple reduction in DC/DC converters.

In an example embodiment the charge current control may be implemented with circuit 500 of FIG. 5. Circuit 500 of FIG. 5 includes counter 510; current sources 520A, 520B, and 520C; comparator 530; and capacitor 540. In this example embodiment, counter 510 is a three-bit counter, but any size counter can be implemented. The size of the counter affects the resolution of the step-size of the inductor current value in DCM. For example, a two-bit counter may provide four steps of inductor current values. A three-bit counter may provide 8 steps of inductor current values. A four bit counter may provide 16 steps of inductor current values, and so on. In an example embodiment, if the period is longer than the maximum count of the counter, the output remains at its maximum value.

In an example embodiment, there is a current source 520A, 520B, and 520C corresponding to each bit of the counter and current source 520D. A three-bit counter may be electrically connected to three current sources. In alternative embodiments, there may be more or less current sources compared to the number of bits in the counter. The current sources charge capacitor 540 which provides the inductor current. In this example embodiment, each of current sources 520A, 520B, and 520C may have increasing values, each a factor of two larger than the previous current source and current source 520D may be a factor of the lowest value, or, alternatively, current source 520D may be set to the lowest current level designed to effectively charge ramp capacitor 540. For example, if current source 520A is 10 uA, 520B may be 20 uA, and current source 520C may be 40 uA. This example embodiment provides a linear progression of the inductor current as the three-bit counter progresses from zero to eight. In alternative embodiments, the current sources may be sized to have exponential, logarithmic, or any other relationship. One or more of the current sources may be internal to a PWM controller semiconductor device, or, alternatively, configured in a circuit or device external to the PWM controller semiconductor device.

In an example embodiment, in CCM, current source 520D is used to source the current for the rising ramp signal. In DCM, as the output of counter 510 increases, one or more of the current sources are switched in or out. As the output of counter 510 changes, the current sourced to charge ramp capacitor 540 is changed to coincide with counter 510. In this example embodiment, a three-bit counter is used and four current sources are used. In alternative embodiments, larger counters can be used or current sources can be used to implement a finer step size to the inductor current or for the rising ramp, and, therefore, the inductor current.

In an example embodiment, current source 520C is 40 uA and corresponds to the most significant bit (MSB) of the output of three-bit counter 510. Current source 520B is 20 uA and corresponds to the middle bit of the output of three-bit counter 510. Current source 520A is 10 uA and corresponds to the least significant bit (LSB) of the output of three-bit counter 510. When the output of three-bit counter 510 is 000, all three current sources 520A, 520B, and 520C are electrically disconnected and the only connected current source is current source 520D, for example, 35 uA. When the output of three-bit counter 510 is 111, current sources 520A, 520B, 520C, and 520D are used to charge ramp capacitor 540. When the output of three-bit counter 510 is 001, current sources 520A and 520D charge capacitor 540 with 45 uA. When the output of three-bit counter 510 is 010, current sources 520B and 520D charge capacitor 540 with 55 uA. When the output of three-bit counter 510 is 011, current sources 520A, 520B, and 520D charge capacitor 540 with 65 uA. When the output of three-bit counter 510 is 100, current sources 520C and 520D charge capacitor 540 with 75 uA. When the output of three-bit counter 510 is 101, current sources 520A, 520C, and 520D charge capacitor 540 with 85 uA. When the output of three-bit counter 510 is 110, current sources 520B, 530C, and 530D charge capacitor 540 with 95 uA. This provides a step size of 10 uA for each increase in the inductor peak period. Other counter sizes and current source sizes would produce different values, but be included in the spirit of this disclosure.

Figure 6:
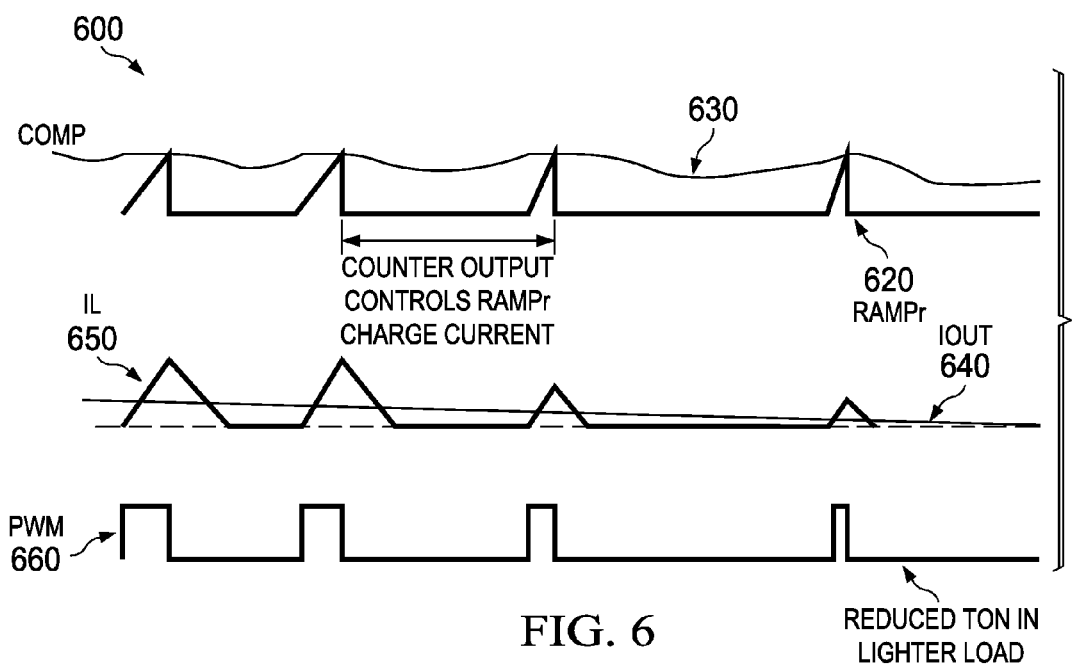
FIG. 6 is a timing diagram of an example embodiment of a circuit using the disclosed systems and methods of ripple reduction in DC/DC converters.

FIG. 6 provides timing diagram 600 of the signals used to adjust the inductor current. As load current 640 decreases, inductor current 650 is decreased according to the counter, which decreases the ripple on the output voltage. As the counter output increases, inductor current 650 is decreased. The inductor current pulse peak is determined by rising ramp 620 crossing error amplifier output (COMP) signal 630. This coincides with a falling edge in PWM signal 660. The ON time of PWM signal 660 may be reduced by the increasing the ramp charging current. Therefore the output voltage ripple can be reduced. In a light load condition, as the distance between the inductor current pulses becomes larger, the counter controls the charge current of rising ramp signal 620 by controlling the current source that charges the ramp capacitor. The ramp capacitor and the current source control the slew rate of rising ramp 620 that supplies inductor current 650. As the counter output increases, the value of the current source is decreased and the magnitude of inductor current 650 becomes smaller. A decrease in the magnitude of inductor current 650 leads to a decreased ripple on the output voltage of the converter.

Figure 7:
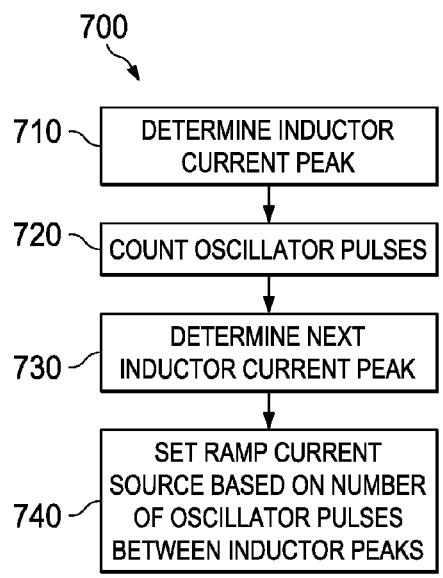
FIG. 7 is a flow diagram of an example embodiment of the disclosed methods of ripple reduction in DC/DC converters.

In FIG. 7, flow diagram 700 provides an example embodiment of a method of ripple reduction in DC/DC converters. In block 710, a first inductor peak current occurrence is determined. In an example embodiment, this may be determined by a falling edge of the PWM signal. In block 720, the counter begins counting oscillator periods. In an example embodiment, this may be performed by counting the number of pulses of MCLCK 505. In block 730 the next inductor peak current output is determined. In an example embodiment, each time a falling edge of the PWM signal occurs, counter 510 is reset. In block 740, the current sourced to capacitor 540 is set based on the number of oscillator pulses counted between inductor current pulses. In an example embodiment, the output of the counter may actively adjust the current source array of 520A, 520B, and 520C to charge ramp capacitor 540. In an alternative embodiment, the output of the counter may have latched outputs and the source current for capacitor 540 may be updated upon each falling edge of the PWM signal. These embodiments alone or in combination may be implemented to adjust the inductor current based on reduced output load requirements to reduce the output ripple voltage associated with the inductor current.

Although the present invention has been described in detail, it should be understood that various changes, substitutions and alterations can be made thereto without departing from the spirit and scope of the invention as defined by the appended claims.

Therefore, at least the following is claimed:

1. A method comprising:
   regulating an output with a pulse width modulation (PWM) circuit comprising at least one inductor, an oscillator and an error amplifier output compared with a rising ramp signal;
   counting with an x-bit counter a number of periods of the oscillator between inductor current pulses, where x is the number of bits of the counter; and
   adjusting a slope of the rising ramp signal dependent on an output of the counter.

2. The method of claim 1, wherein the adjusting of the slope of the rising ramp comprises adjusting the connections of a plurality of current sources.

3. The method of claim 2, wherein the plurality of current sources comprises x current sources.

4. The method of claim 2, wherein each of the plurality of current sources has a different current value.

5. The method of claim 4, wherein each current source of the plurality of current sources is proportional to another current source of the plurality of current sources by a power of 2.

6. The method of claim 1, wherein the counter is clocked by the oscillator and the counter counts the period of inductor current peaks as reflected in the pulse width modulated signal.

7. The method of claim 1, wherein the output of the counter is substantially equal to the modulus of a period between consecutive peaks of an inductor current minus one.

8. The method of claim 1, wherein a counter reset is not related to a width of the PWM ON pulse.

9. A power supply control circuit, comprising:
- a comparator configured to compare an output of an error amplifier with a rising ramp signal to produce a pulse width modulated (PWM) signal;
- a counter electrically connected to the comparator, the counter clocked by a system oscillator, the counter configured to count a number of pulses of a system oscillator between a succession of current peaks in an inductor; and
- a plurality of current sources electrically connected to the counter, the plurality of current sources configured to charge a ramp capacitor, the charging of the ramp capacitor producing the rising ramp signal.

10. The power supply control circuit of claim 9, wherein each of successive inductor current peaks is determined by a falling edge of the PWM signal.

11. The power supply control circuit of claim 9, wherein the number of the plurality of current sources corresponds to the number of bits of the counter.

12. The power supply control circuit of claim 9, wherein each of the plurality of current sources has a different current value.

13. The power supply control circuit of claim 9, wherein each current source of the plurality of current sources is proportional to another current source of the plurality of current sources by a power of 2.

14. The power supply control circuit of claim 9, wherein the counter is reset for inductor current zero crossings.

15. The power supply control circuit of claim 14, further comprising a comparator configured to determine when the inductor current falls below zero.

16. A pulse width modulation (PWM) controller device, comprising:
- a comparator configured to compare an output of an error amplifier with a rising ramp signal to produce a pulse width modulated (PWM) signal;
- a counter electrically connected to the comparator, the counter clocked by a system oscillator, the counter configured to count a number of system oscillator pulses between a succession of current peaks in an inductor; and
- a plurality of current sources electrically connected to the counter, the plurality of current sources configured to charge a ramp capacitor relative to the output of the counter, the charging of the ramp capacitor producing the rising ramp signal.

17. The system of claim 16, wherein one of the plurality of current sources is directly connected to the ramp capacitor, the remaining current sources of the plurality of current sources are electrically connected to the ramp capacitor through switches, and a number of the remaining current sources of the plurality of current sources corresponds to the number of bits of the counter.

18. The system of claim 16, wherein each of the plurality of current sources has a different current value.

19. The system of claim 16, wherein each current source of the plurality of current sources is proportional to another current source of the plurality of current sources by a power of 2.

20. The system of claim 16, wherein the counter is reset when an inductor has a current zero crossing.

* * * * *